United States Patent
Tsao et al.

(10) Patent No.: US 11,424,204 B2
(45) Date of Patent: Aug. 23, 2022

(54) SEMICONDUCTOR COMPONENT AND MANUFACTURING METHOD THEREOF

(71) Applicant: MEDIATEK Inc., Hsin-Chu (TW)

(72) Inventors: Po-Chao Tsao, Hsin-Chu (TW); Yu-Hua Huang, Hsin-Chu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/928,089

(22) Filed: Jul. 14, 2020

(65) Prior Publication Data
US 2021/0050315 A1   Feb. 18, 2021

Related U.S. Application Data

(60) Provisional application No. 62/887,075, filed on Aug. 15, 2019.

(51) Int. Cl.
*H01L 23/00* (2006.01)

(52) U.S. Cl.
CPC .............. *H01L 24/05* (2013.01); *H01L 24/03* (2013.01); *H01L 2224/02205* (2013.01); *H01L 2224/0311* (2013.01); *H01L 2224/03614* (2013.01); *H01L 2224/04042* (2013.01); *H01L 2224/05551* (2013.01); *H01L 2224/05554* (2013.01); *H01L 2224/05557* (2013.01)

(58) Field of Classification Search
CPC . H01L 24/05; H01L 24/03; H01L 2224/0311; H01L 2224/05551
See application file for complete search history.

(56) References Cited

U.S. PATENT DOCUMENTS

| 6,287,950 B1 | 9/2001 | Wu et al. |
| 10,038,025 B2 | 7/2018 | Huang et al. |
| 10,109,666 B2 | 10/2018 | Cheng et al. |
| 2004/0070079 A1* | 4/2004 | Huang ............... H01L 24/13 257/778 |
| 2008/0197353 A1 | 8/2008 | Takahashi et al. |
| 2013/0234309 A1 | 9/2013 | Shin et al. |
| 2015/0194395 A1* | 7/2015 | Safai ................ H01L 24/03 257/784 |

FOREIGN PATENT DOCUMENTS

| JP | 2016167536 A | 9/2016 |
| TW | 201725715 A | 7/2017 |
| TW | 201737450 A | 10/2017 |

OTHER PUBLICATIONS

TW Office Action dated Mar. 23, 2021 in Taiwan application (No. 109125328).
EP Search Report dated Nov. 6, 2020 in EP Application (No. 20188651.2-1212).

* cited by examiner

*Primary Examiner* — Dale E Page
*Assistant Examiner* — Wilner Jean Baptiste
(74) *Attorney, Agent, or Firm* — McClure, Qualey & Rodack, LLP (57) ABSTRACT

A semiconductor component is provided. The semiconductor component includes a substrate and a pad. The pad has an upper surface and a slot, wherein the slot is recessed with respect to the upper surface.

17 Claims, 8 Drawing Sheets

SEMICONDUCTOR COMPONENT AND MANUFACTURING METHOD THEREOF

This application claims the benefit of U.S. Provisional application Ser. No. 62/887,075, filed Aug. 15, 2019, the disclosure of which is incorporated by reference herein in its entirety.

FIELD OF THE INVENTION

The invention relates to a semiconductor component and a manufacturing method thereof, and more particularly to a semiconductor component having a slot and a manufacturing method thereof.

BACKGROUND OF THE INVENTION

Conventional semiconductor component includes a number of pads. After a solder wire is bonded on the pad, force is applied to the pad to make the pad crack or deform to touch adjacent pad (cause electrical short).

SUMMARY OF THE INVENTION

In one embodiment of the invention, a semiconductor component is provided. The semiconductor component includes a substrate and a pad. The pad has an upper surface and a slot, wherein the slot is recessed with respect to the upper surface.

In another embodiment of the invention, a manufacturing method for a semiconductor component is provided. The manufacturing method includes the following steps: forming a pad structure and an etching stop structure on a substrate, wherein the etching stop structure covers the pad structure, wherein the pad structure comprises a pad portion and a periphery portion surrounding the pad portion; removing a periphery portion of the etching stop structure to form a retained portion of the etching stop structure covering the pad portion of the pad structure, wherein the periphery portion of the pad structure is exposed from the retained portion; and forming a slot on the periphery portion of the pad structure to form a pad, wherein the slot is recessed with respect to an upper surface of the pad.

Numerous objects, features and advantages of the invention will be readily apparent upon a reading of the following detailed description of embodiments of the invention when taken in conjunction with the accompanying drawings. However, the drawings employed herein are for the purpose of descriptions and should not be regarded as limiting.

BRIEF DESCRIPTION OF THE DRAWINGS

The above objects and advantages of the invention will become more readily apparent to those ordinarily skilled in the art after reviewing the following detailed description and accompanying drawings, in which.

DETAILED DESCRIPTION OF PREFERRED EMBODIMENTS

Figure 1A:
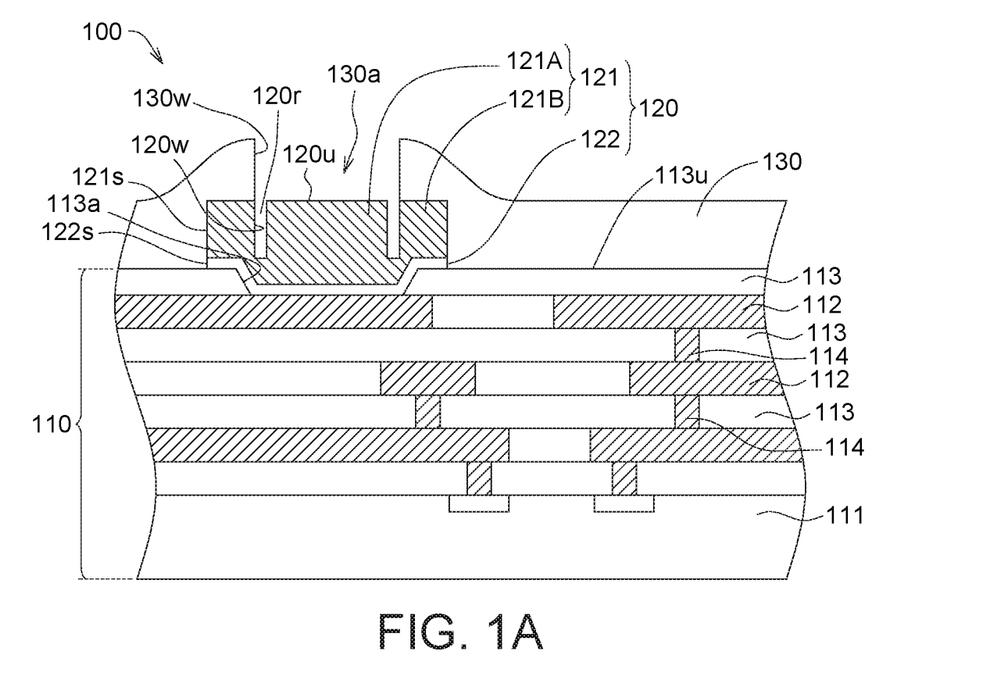
FIG. 1A illustrates a diagram view of a semiconductor chip 100 according to an embodiment of the invention.
Figure 1B:
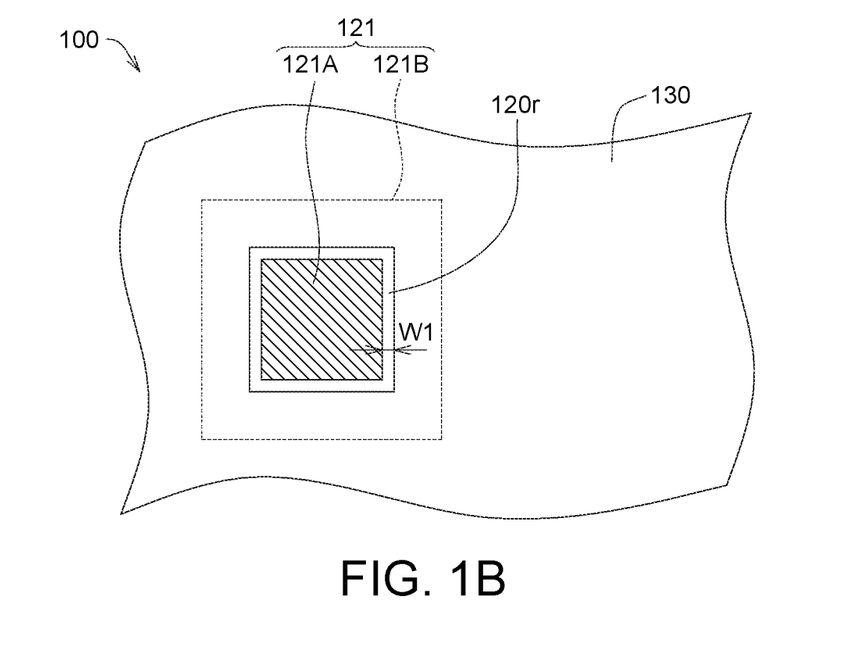
FIG. 1B illustrates a top view of the semiconductor chip 100 of FIG. 1A.
Figure 1C:
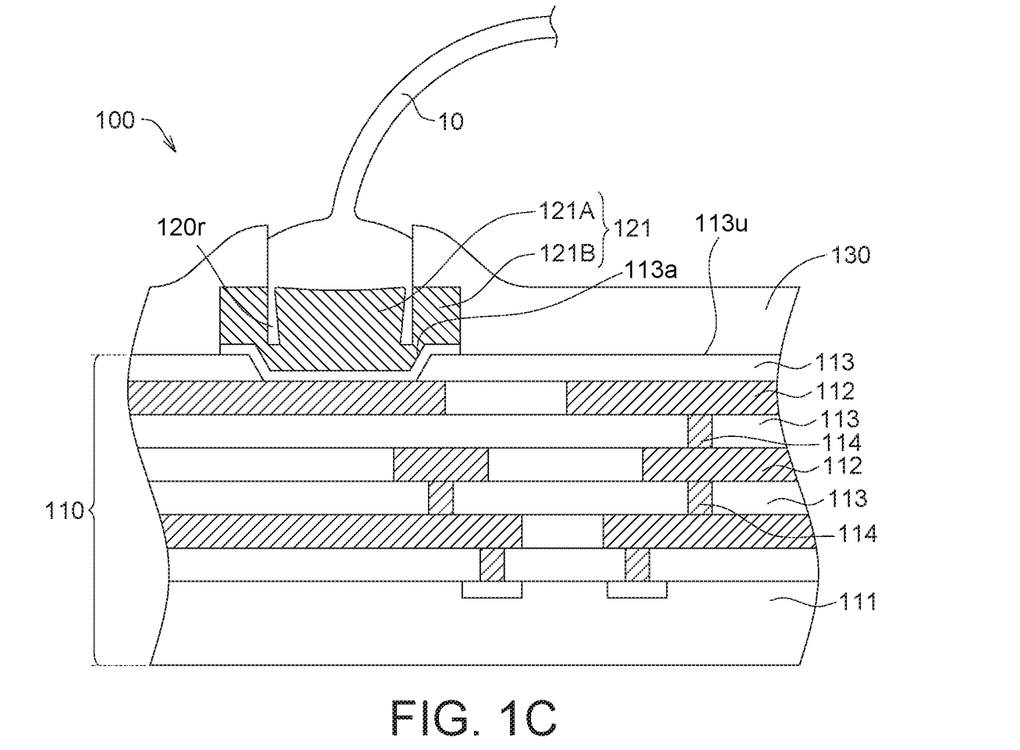
FIG. 1C illustrates a diagram view of a solder wire 10 bonded on a pad 120 of the semiconductor chip 100 of FIG. 1A.

Referring to FIGS. 1A to 1C, FIG. 1A illustrates a diagram view of a semiconductor chip 100 according to an embodiment of the invention, FIG. 1B illustrates a top view of the semiconductor chip 100 of FIG. 1A, and FIG. 1C illustrates a diagram view of a solder wire bonded on a pad 120 of the semiconductor chip 100 of FIG. 1A. In an embodiment, the semiconductor component 100 is, for example, a semiconductor substrate, a semiconductor chip, etc.

The semiconductor component 100 includes a substrate 110, at least one pad 120 and a passivation layer 130.

The substrate 110 includes a base 111, a plurality of conductive layers 112, a plurality of dielectric layers 113 and a plurality of conductive vias 114. The base 11 is, for example, silicon wafer. The conductive layers 112, the dielectric layers 113 and the conductive vias 114 are formed on the base 111 by using semiconductor processes. Adjacent two conductive layers 112 is separated from each other by one dielectric layers 113 and are electrically connected by at least one conductive via 114.

As illustrated in FIG. 1A, the pad 120 could be multi-layered structure. For example, the pad 120 includes a pad layer 121 and a barrier layer 122. The pad layer 121 is, for example, made of aluminum, gold, silver, copper or combination thereof. The barrier layer 122 is, for example, made of nickel (Ni), nickel-alloy, titanium nitride (TiN) or combination thereof. At least one portion of the barrier layer 122 is formed within an opening 113a of the topmost dielectric layer 113, and the pad layer 121 is formed on the barrier layer 122. The pad layer 121 is projected with respect to an upper surface 113u of the dielectric layer 113. The pad layer 121 has a first lateral surface 121s, and the barrier layer 122 has a second lateral surface 122s, wherein the first lateral surface 121s and the barrier layer 122 are aligned with each other, for example, the first lateral surface 121s and the barrier layer 122 are flush with each other.

Each pad 120 has an upper surface 120u and a slot 120r, wherein the slot 120r is recessed with respect to the upper surface 120u and extends toward the substrate 110. The pad 120 includes a pad portion 121A and a periphery portion 121B, for example, the pad layer 121 of the pad 120 includes the pad portion 121A and the periphery portion 121B, wherein the periphery portion 121B surrounds the pad portion 121A, and the slot 120r is formed between the pad portion 121A and the periphery portion 121B.

As illustrated in FIG. 1C, a solder wire 10 is bonded on the corresponding pad 120. After the solder wire 10 is bonded on the pad 120, the solder wire 10 is partially formed within the slot 120r, and at least one portion of the slot 120r is filled with the solder wire 10, The slot 120r could provide a deformed portion of the pad portion 121A with space for receiving the deformed portion of the pad portion 121A. Furthermore, during the solder wire 10 is bonded on the pad 120, the slot 120r could receive the deformation (resulted from the pressure being applied by the soldering tool on the pad 120) of the pad portion 121A, and thus it could prevent the pad 120 from cracking or touching adjacent pad due to over-deformation and/or the damage of the passivation layer 130. In other words, the slot 120r could receive the deformation of the pad portion 121A and/or reduce or release the stress of the pad 120. As a result, a pitch between adjacent two pads 120 could be shrunk. In an embodiment, the pitch between adjacent two pad 120 could be shrunk to 5% to 15% compared to pitch between adjacent two pads without slot 121r.

As illustrated in FIG. 1B, the slot 120r is a ring-shaped slot, for example, a closed ring-shaped slot or an open ring-shaped slot. In addition, the slot 120r extends in polygonal shape, circular shape, oval, etc. The slot 120r has a width W1 ranging between 0.1 micrometers (mm) and 2.0 mm, for example, 0.1 mm; however, such exemplification is not meant to be for limiting.

As illustrated in FIG. 1C, the slot 120r is located between the pad portion 121A and the periphery portion 121B. The pad portion 121A is configured to carry the solder wire 10. When the soldering tool applies force to the pad 120, the pad portion 121A is deformed outwardly, and the slot 120r could receive the deformed pad portion 121A. As a result, even if the pad 120 deforms, the deformed pad 120 will not touch adjacent pad or adjacent electrical component.

As illustrated in FIG. 1A, the passivation layer 130 has at least one opening 130a. A first inner sidewall 130w of the opening 130a is aligned with a second inner sidewall 120w of the slot 120r, for example, the first inner sidewall 130w of the opening 130a is flush with the second inner sidewall 120w of the slot 120r.

FIGS. 2A to 2I illustrate manufacturing processes of the semiconductor component 100 of FIG. 1A.

Figure 2A:
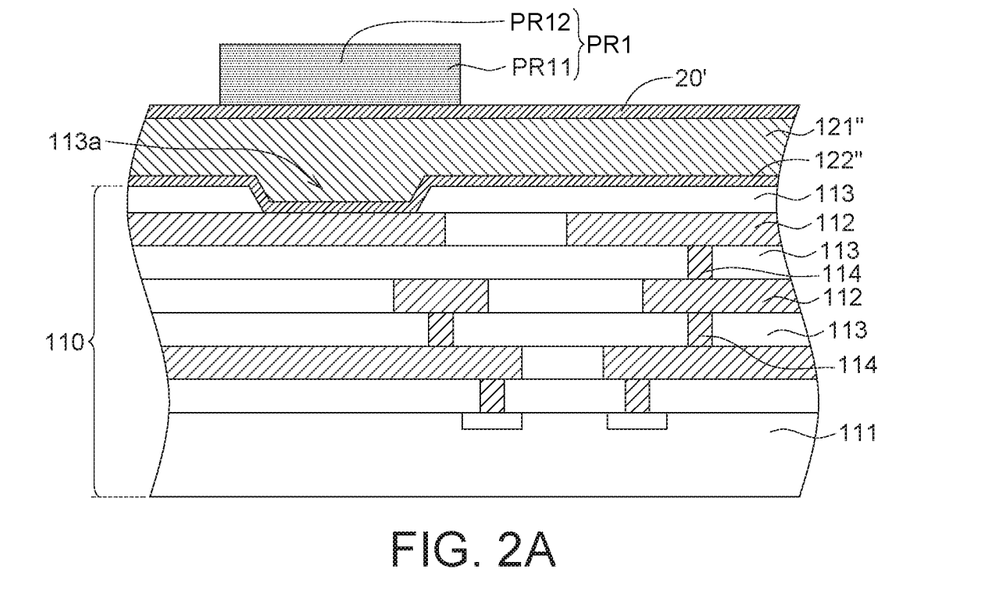
FIGS. 2A to 2I illustrate manufacturing processes of the semiconductor component 100 of FIG. 1A.

As illustrated in FIG. 2A, a barrier layer material 122" covering the substrate 110 is formed by using deposition technologies. The available technologies include but limited to physical vapor deposition (PVD), chemical vapor deposition (CVD), electrochemical deposition (ECD), molecular beam epitaxy (MBE) and more recently, atomic layer deposition (ALD) among others. Then, a first pad layer material 121" covering the barrier layer material 122" is formed by using back end of line (BEOL) technologies. Then, an etching stop structure material 20' covering the first pad layer material 121" is formed by using deposition technologies. The available technologies include but limited to physical vapor deposition, chemical vapor deposition, electrochemical deposition, molecular beam epitaxy and more recently, atomic layer deposition (ALD) among others.

Then, as illustrated in FIG. 2A, a first patterned photoresist PR1 covering a portion of the etching stop structure material 20' is formed by using deposition technologies. The available technologies include but limited to physical vapor deposition, chemical vapor deposition, electrochemical deposition, molecular beam epitaxy and more recently, atomic layer deposition among others. The first patterned photoresist PR1 defines a retained portion PR12 and a periphery portion PR11 connected to and surrounding the retained portion PR12. The first patterned photoresist PR1 is located right above the opening 113a of the topmost dielectric layer 113.

Figure 2B:
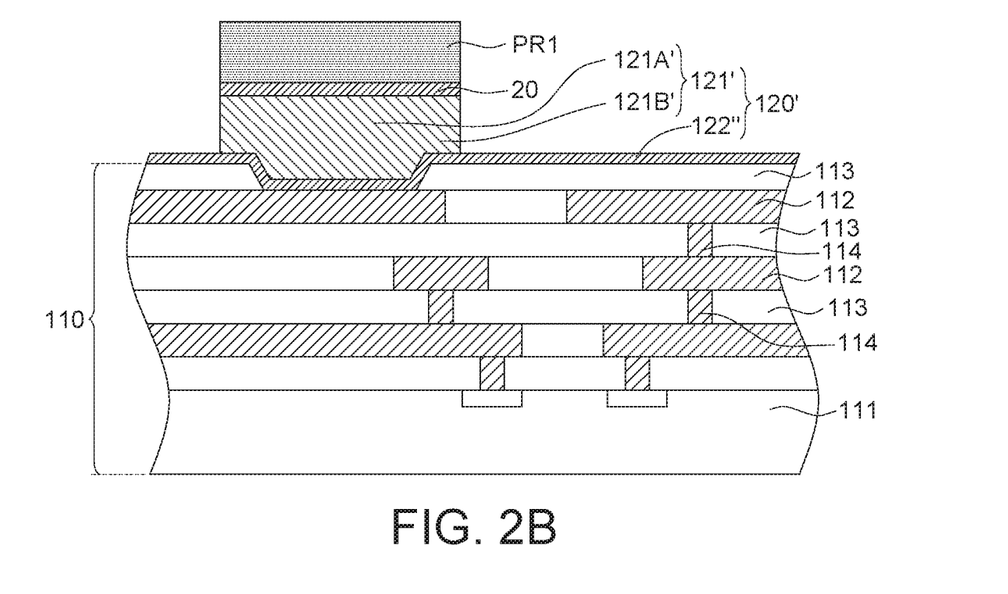

Then, as illustrated in FIG. 2B, a portion of the etching stop structure material 20' is removed to form the etching stop structure 20 through the first patterned photoresist PR1. For example, the portion of the etching stop structure material 20' which is not covered by the first patterned photoresist PR1 is removed to form the etching stop structure 20.

As illustrated in FIG. 2B, a portion of the first pad layer material 121" is removed to form a second pad layer material 121' of a pad structure 120' through the first patterned photoresist PR1 by using etching technology. The pad structure 120' further includes the barrier layer material 122". In the present embodiment, the barrier layer material 122' could serve as an etching stop layer, and thus the etching for the first pad layer material 121" (illustrated in FIG. 2A) could stop at the barrier layer material 122". As illustrated in FIG. 2B, the second pad layer material 121' includes the pad portion 121A' and the periphery portion 121B' connected to and surrounding the pad portion 121A'.

In the present embodiment, the etching stop structure 20 and the pad structure 120' are formed in the same etching process through the same first patterned photoresist PR1.

Figure 2C:
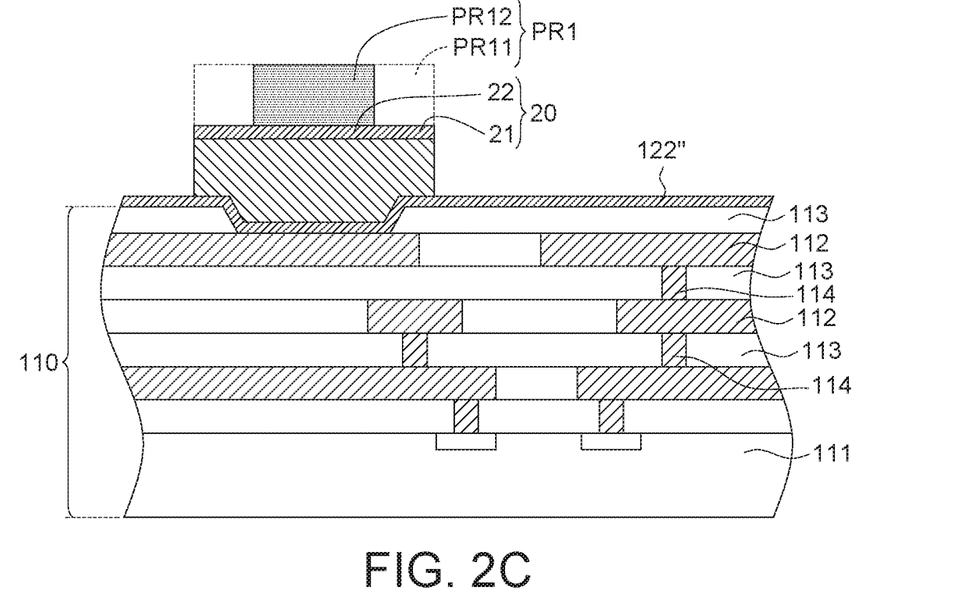

As illustrated in FIG. 2C, the periphery portion PR11 of the first patterned photoresist PR1 is removed to expose the periphery portion 21 of the etching stop structure 20 by using etching process. In etching process, the retained portion PR12 of the first patterned photoresist PR1 covering the retained portion 22 of the etching stop structure 20 is retained.

Figure 2D:
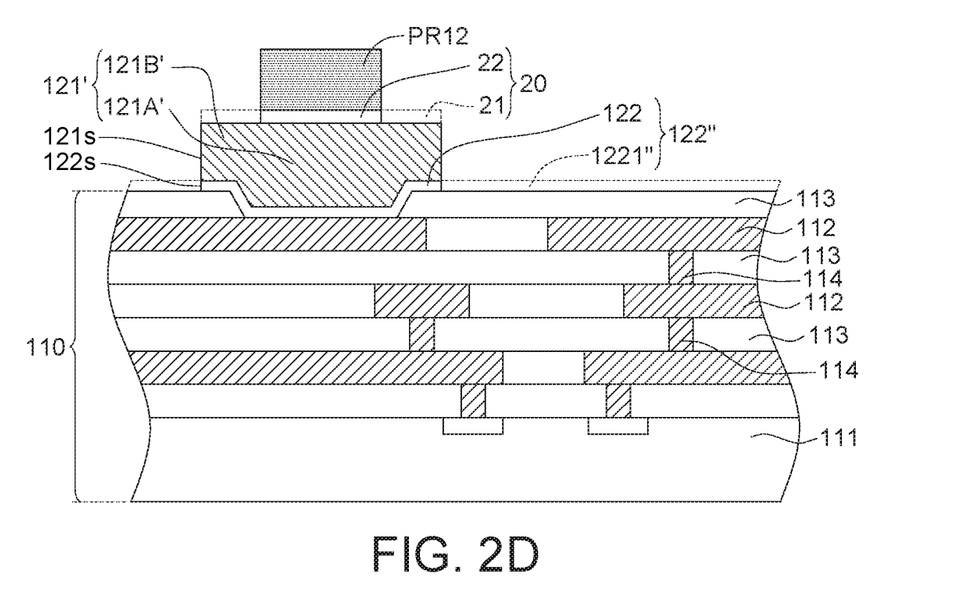

As illustrated in FIG. 2D, the periphery portion 21 of the etching stop structure 20 is removed through the retained portion PR12 of the first patterned photoresist PR to expose the periphery portion 121a of the second pad layer material 121' by using etching process, and the retained portion 22 covering the pad portion 121A' is retained.

In FIG. 2D, a removed portion 1221" of the barrier layer material 122" is removed to expose the dielectric layer 113 by using etching process, and the barrier layer 122 of the barrier layer material 122" covering the dielectric layer 113 is retained.

In an embodiment, the periphery portion 21 of the etching stop structure 20 and the removed portion 1221" are removed in the same etching process (or simultaneously). In addition, after etching, the pad layer 121 has the first lateral surface 121s, and the barrier layer 122 has the second lateral surface 122s, wherein the first lateral surface 121s and the barrier layer 122 are aligned with each other, for example, the first lateral surface 121s and the barrier layer 122 are flush with each other.

Figure 2E:
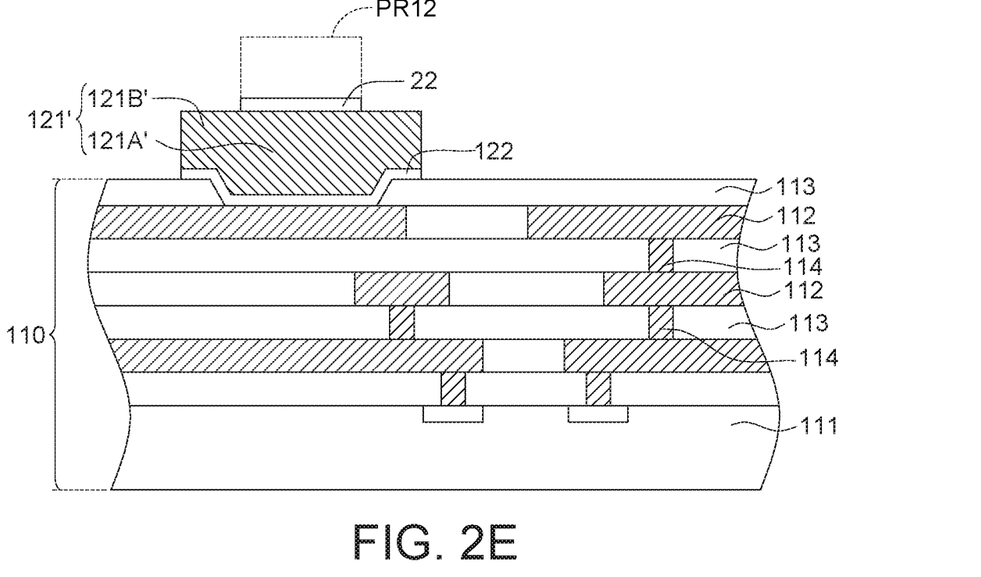

As illustrated in FIG. 2E, the retained portion PR12 of the first patterned photoresist PR1 is removed, by using etching process, to expose the retained portion 22 of the etching stop structure 20.

Figure 2F:
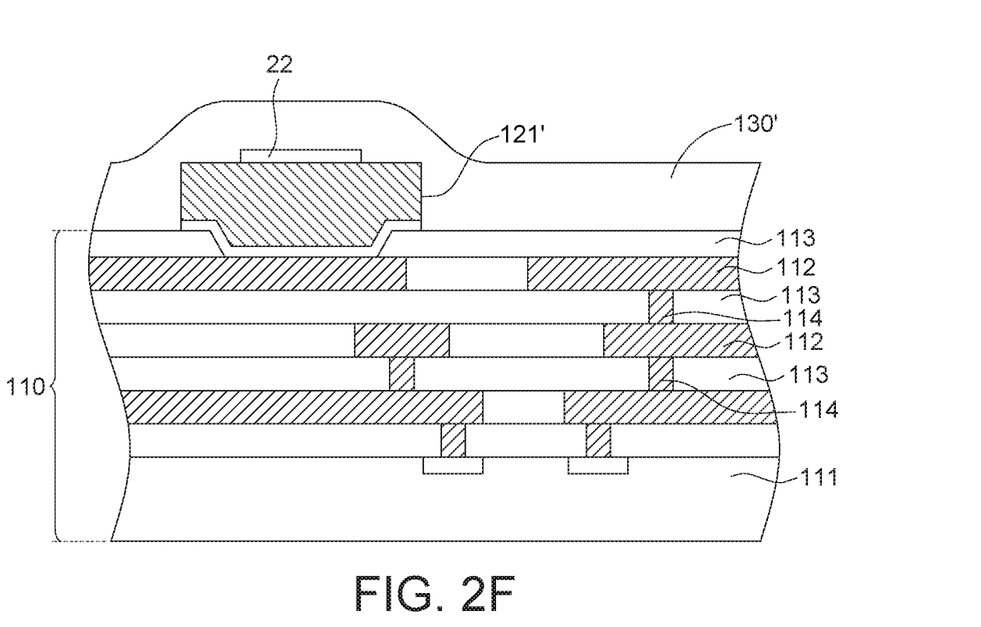

As illustrated in FIG. 2F, the passivation layer material 130' covering the retained portion 22, the second pad layer material 121' and the dielectric layer 113 is formed by using deposition technologies. The available technologies include but limited to physical vapor deposition (PVD), chemical vapor deposition (CVD), electrochemical deposition (ECD), molecular beam epitaxy (MBE) and more recently, atomic layer deposition (ALD) among others.

Figure 2G:
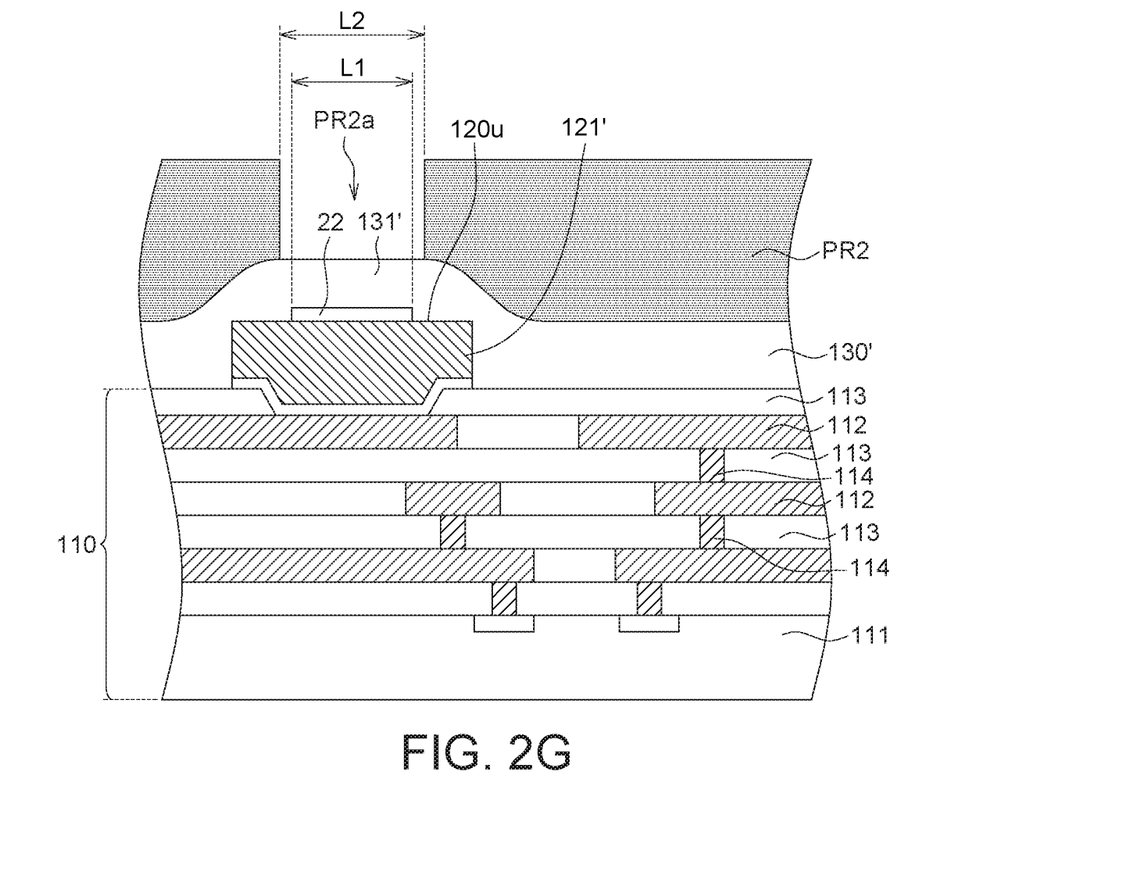

As illustrated in FIG. 2G, a second patterned photoresist PR2 covering the passivation layer material 130' is formed by using deposition technologies. The available technologies include but limited to physical vapor deposition, chemical vapor deposition, electrochemical deposition, molecular beam epitaxy and more recently, atomic layer deposition among others. The second patterned photoresist PR2 has at least one opening PR2a exposing a exposed portion 131' of the passivation layer material 130', wherein the exposed portion 131' is located right above the retained portion 22.

In FIG. 2G, the retained portion 22 has a first width L1, and the opening PR2a has a second width L2, wherein the second width L2 is greater than the first width L1. For example, the width difference between the first width L1 and the second width L2 ranges between 0.05 mm and 2 mm.

Figure 2H:
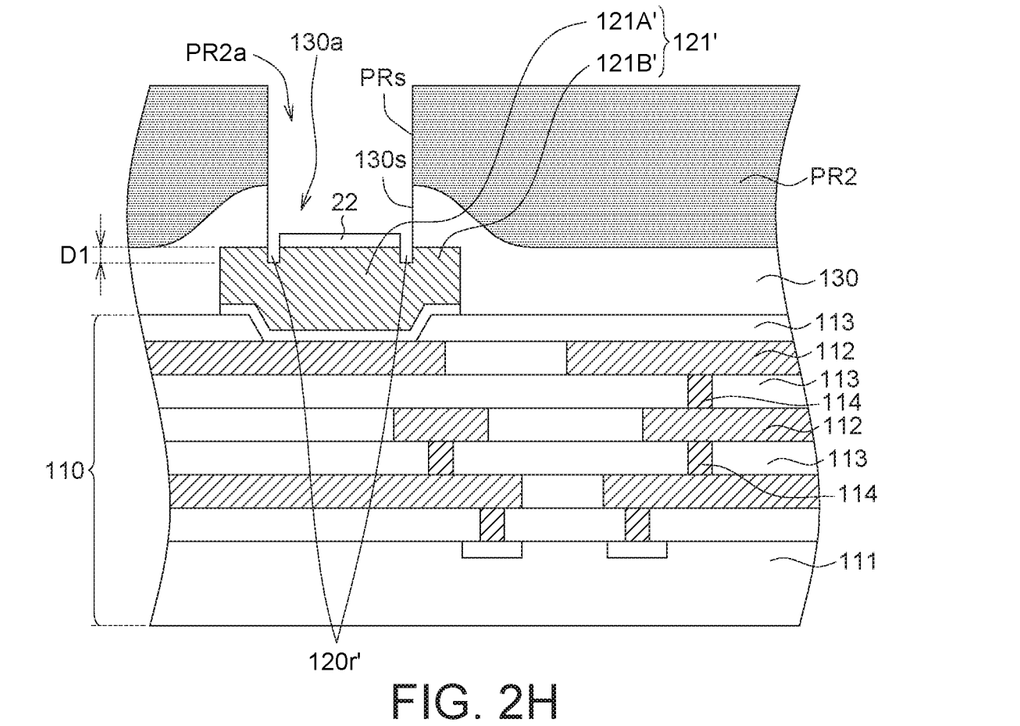

As illustrated in FIG. 2H, an opening 130a is formed on the passivation layer material 130', through the opening PR2a of the second patterned photoresist PR2, to form the passivation layer 130 by using etching process. The opening 130 of the passivation layer 130 exposes the pad portion 121A of the second pad layer material 121' and the retained portion 22, for example, exposes the entire retained portion 22. After etching, the second patterned photoresist PR2 has an inner sidewall PRs, and the opening 130a of the passivation layer 130 has an inner sidewall 130s, wherein the inner sidewall PRs and the inner sidewall 130s are aligned with each other, for example, the inner sidewall PRs and the inner sidewall 130s are flush with each other.

In FIG. 2H, in etching process, a recess 120r' extending from the upper surface 120u (illustrated in FIG. 2G) of the pad portion 121A' of the second pad layer material 121' toward the substrate 110 through opening PR2a of the second patterned photoresist PR2 and the opening 130a of the passivation layer 130 is formed. The recess 120r' has a first depth D1.

Figure 2I:
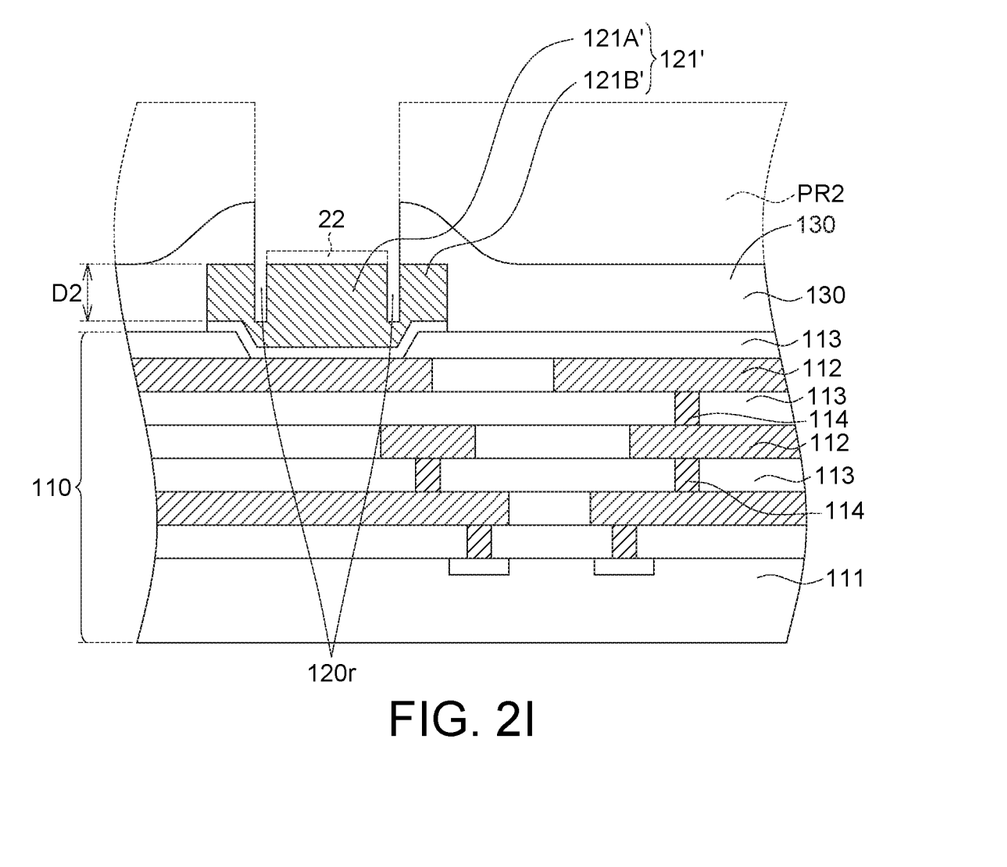

As illustrated in FIG. 2I, the retained portion 22 of the etching stop structure 20 is removed by using etching process. In etching process, the recess 120r' extends toward the substrate 110 to form the slot 120r'. The slot 120r has a second depth D2 greater than the first depth D1 of the recess 120r'. In same etching process, the slot 120r is formed and the retained portion 22 is removed. In other words, the slot 120r is formed in process of removing the retained portion 22, and additional photo mask is not needed.

Then, the second patterned photoresist PR2 is removed to expose the passivation layer 130, and then the semiconductor component 100 is formed.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A semiconductor component, comprising:
   a substrate; and
   a pad having an upper surface and a slot;
   wherein the slot is recessed with respect to the upper surface;
   wherein the semiconductor component further comprises a passivation layer comprising a covering portion, the covering portion covers a covered portion of the pad and has an opening, a first inner sidewall of the opening is aligned with a second inner sidewall of the slot;
   wherein the pad is a conductive pad and the passivation layer is an insulative layer.

2. The semiconductor component as claimed in claim 1, wherein the pad comprises a pad portion and a periphery portion surrounding the pad portion, and the slot is located between the pad portion and the periphery portion.

3. The semiconductor component as claimed in claim 1, wherein the slot is a ring-shaped slot.

4. The semiconductor component as claimed in claim 3, wherein the slot is a closed ring-shaped slot.

5. The semiconductor component as claimed in claim 1, wherein the slot has a width ranging between 0.1 micrometers and 2.0 micrometers.

6. The semiconductor component as claimed in claim 1, further comprising:
   a solder wire partially formed within the slot.

7. The semiconductor component as claimed in claim 6, wherein at least one portion of the slot is filled with the solder wire.

8. A manufacturing method for the semiconductor component as claimed in claim 1, comprising:
   forming a pad structure and an etching stop structure on the substrate, wherein the etching stop structure covers the pad structure, wherein the pad structure comprises a pad portion and a periphery portion surrounding the pad portion;
   removing a periphery portion of the etching stop structure to form a retained portion of the etching stop structure covering the pad portion of the pad structure, wherein the periphery portion of the pad structure is exposed from the retained portion; and
   forming the slot on the periphery portion of the pad structure to form the pad.

9. The manufacturing method as claimed in claim 8, further comprising:
   forming a barrier layer material on the substrate;
   forming a first pad layer material to cover the barrier layer material;
   forming an etching stop structure material to cover the first pad layer material;
   removing a portion of the first pad layer material to form a second pad layer material of the pad structure, wherein the second pad layer material comprises the pad portion and the periphery portion; and
   removing a portion of the etching stop structure material to form the etching stop structure.

10. The manufacturing method as claimed in claim 9, wherein in step of removing the portion of the first pad layer material to form the second pad layer material of the pad structure comprises:
    forming a first patterned photoresist to cover the etching stop structure material;
    removing the portion of the first pad layer material, through the first patterned photoresist, to form the second pad layer material of the pad structure;
    wherein in step of removing the portion of the etching stop structure material to form the etching stop structure comprises:
    removing the portion of the etching stop structure material, through the first patterned photoresist, to form the etching stop structure.

11. The manufacturing method as claimed in claim 10, further comprising:
    removing a periphery portion of the first patterned photoresist, wherein a retained portion of the first patterned photoresist covering the retained portion of the etching stop structure is retained;
    wherein in step of removing the periphery portion of the etching stop structure to form the retained portion of the etching stop structure covering the pad portion of the pad structure further comprises:
    removing the periphery portion of the etching stop structure, through the retained portion of the first patterned photoresist, to form the retained portion of the etching stop structure and expose the periphery portion of the second pad layer material; and
    removing the first patterned photoresist to expose the retained portion of the etching stop structure.

12. The manufacturing method as claimed in claim 9, further comprising:
    removing a removed portion of the barrier layer material to form a barrier layer of the pad covered by the pad portion.

13. The manufacturing method as claimed in claim 12, wherein step of removing the removed portion of the barrier layer material and step of removing a periphery portion of the etching stop structure are performed in the same process.

14. The manufacturing method as claimed in claim 8, further comprising:
   forming a passivation layer material to cover the retained portion of the etching stop structure;
   forming an opening on the passivation layer material; and
   forming a recess to extend from the upper surface of the pad toward the substrate.

15. The manufacturing method as claimed in claim 14, further comprising:
   removing the retained portion of the etching stop structure; and
   extending the recess to form the slot.

16. The manufacturing method as claimed in claim 8, further comprising:
   forming a passivation layer material to cover the retained portion of the etching stop structure;
   forming a second patterned photoresist to cover the passivation layer material, wherein the second patterned photoresist has an opening exposing an exposed portion of the passivation layer material;
   forming an opening on the passivation layer material, through the opening of the second patterned photoresist, to form the passivation layer;
   forming a recess, through the opening of the second patterned photoresist, to extend from an upper surface of the pad toward the substrate through the opening of the passivation layer.

17. The manufacturing method as claimed in claim 16, wherein step of removing the retained portion of the etching stop structure and step of extending the recess to form the slot are performed in the same process.

* * * * *